US006796026B2

(12) United States Patent
Pupin et al.

(10) Patent No.: US 6,796,026 B2
(45) Date of Patent: Sep. 28, 2004

(54) TOOL FOR REWORKING A PRESS-FIT CONNECTOR

(75) Inventors: Silvio Pupin, Milan (IT); Franco Scotti, Milan (IT)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 09/997,622

(22) Filed: Nov. 29, 2001

(65) Prior Publication Data

US 2002/0066180 A1 Jun. 6, 2002

(30) Foreign Application Priority Data

Dec. 1, 2000 (GB) ............................................ 0029504

(51) Int. Cl.[7] ............................ H01R 9/00; H05K 3/00

(52) U.S. Cl. .......................... 29/842; 29/426.2; 29/739; 29/740; 29/741; 29/744; 29/762; 29/854; 439/751

(58) Field of Search ................................ 29/842, 426.2, 29/739, 740, 741, 744, 762, 854; 439/751

(56) References Cited

U.S. PATENT DOCUMENTS

| | | | | | |
|---|---|---|---|---|---|
| 5,509,192 | A | * | 4/1996 | Ota et al. | 29/741 |
| 6,138,345 | A | * | 10/2000 | Suzuki et al. | 29/739 |
| 2003/0049972 | A1 | * | 3/2003 | Aoki | 439/751 |

* cited by examiner

*Primary Examiner*—Carl J. Arbes
*Assistant Examiner*—Tim Phan
(74) *Attorney, Agent, or Firm*—Silvy Anna Murphy

(57) ABSTRACT

A tool for reworking a connector attached to an electronic board having a plurality of stacked wafer modules thereon. The tool includes first and second jaws for grasping and removing a selected one of the modules from the board, a holding structure for holding the board, and movement structure for moving the two jaws relative to the holding structure, at least one of the jaws adapted for separating each selected module from a module on each opposing side of the selected module such that removal of the selected module is attained without damage to the separated, adjacent modules.

9 Claims, 6 Drawing Sheets

TOOL FOR REWORKING A PRESS-FIT CONNECTOR

FIELD OF THE INVENTION

The present invention relates to a tool for reworking a press-fit connector.

CROSS REFERENCES TO RELATED DOCUMENT

This application claims the benefit of United Kingdom Patent Application No. 0029504.8, which was filed on 12 Jan. 2000.

BACKGROUND OF THE INVENTION

Connectors are commonly used for joining together electronic assemblies, such as Printed Circuit Boards (PCBs). A particular type of connector is formed by several wafer modules arranged side by side, with each module including a plurality of conductive pins which are press-fitted into corresponding plated holes of the board. Connectors of this type are known, one example being manufactured by Teradyne Inc. and referred to as a VHDM connector.

The modules of the connector are easier to build with the necessary tolerances than a single large connector. Moreover, each module can be individually removed from the board for maintenance operations. Unfortunately, the conductive pins may bend during mounting of the connector on the board when the pins are fitted into the holes (e.g., by means of a press machine). Clearly, when these bent pins cannot be inserted into the holes, the entire faulty module must be replaced.

A known solution for reworking such a connector consists of removing the faulty module from the board by means of pliers, hand-driven by an operator. The operator inserts each jaw of the pliers from the top between the faulty module and the respective adjacent module. The jaws are then closed onto the faulty module, thereby grasping the module, which is then extracted from the board.

One drawback of this solution is that the operation of removing the faulty module may warp or similarly damage one or both of the two adjacent modules, which must then be replaced as well. Moreover, the uncontrolled movement of the operator hand may damage the holes of the board. In this case, if the damage to the holes does not cause an electrical failure immediately detectable, the board is prone to suffer a fault later, which obviously involves a relatively high replacement cost, especially if the board is already installed in a computer.

These drawbacks are particularly acute when some means of engagement between adjacent modules, such as lateral wings, are provided. In this situation, it has been proposed to insert a shim between the faulty module and each adjacent module, in order to separate and unlock the modules. However, the insertion of the shims is not an easy operation; moreover, the use of such shims increases the risk of damaging the adjacent modules and/or the board.

It is believed that a tool for effectively reworking a press-fit connector which overcomes the aforementioned and other disadvantages would represent an advancement in the art.

SUMMARY OF THE INVENTION

According to one aspect of the present invention, there is provided a tool for reworking a press-fit connector attached to an electronic circuit board or the like. The tool comprises first and second jaws for grasping and removing a selected one of the modules from the board, a holding structure for holding the board, and movement structure for moving the jaws relative to the holding structure, at least one of the jaws adapted for separating a module adjacent the selected module from the selected module such that the selected module can be removed from the connector without damage to the modules adjacent the selected module.

BRIEF DESCRIPTION OF THE DRAWINGS

Further features and advantages of the present invention will be made clear by the following description of a preferred embodiment thereof, with reference to the attached figures, in which.

DETAILED DESCRIPTION OF THE PREFERRED EMBODIMENTS

Figure 1:
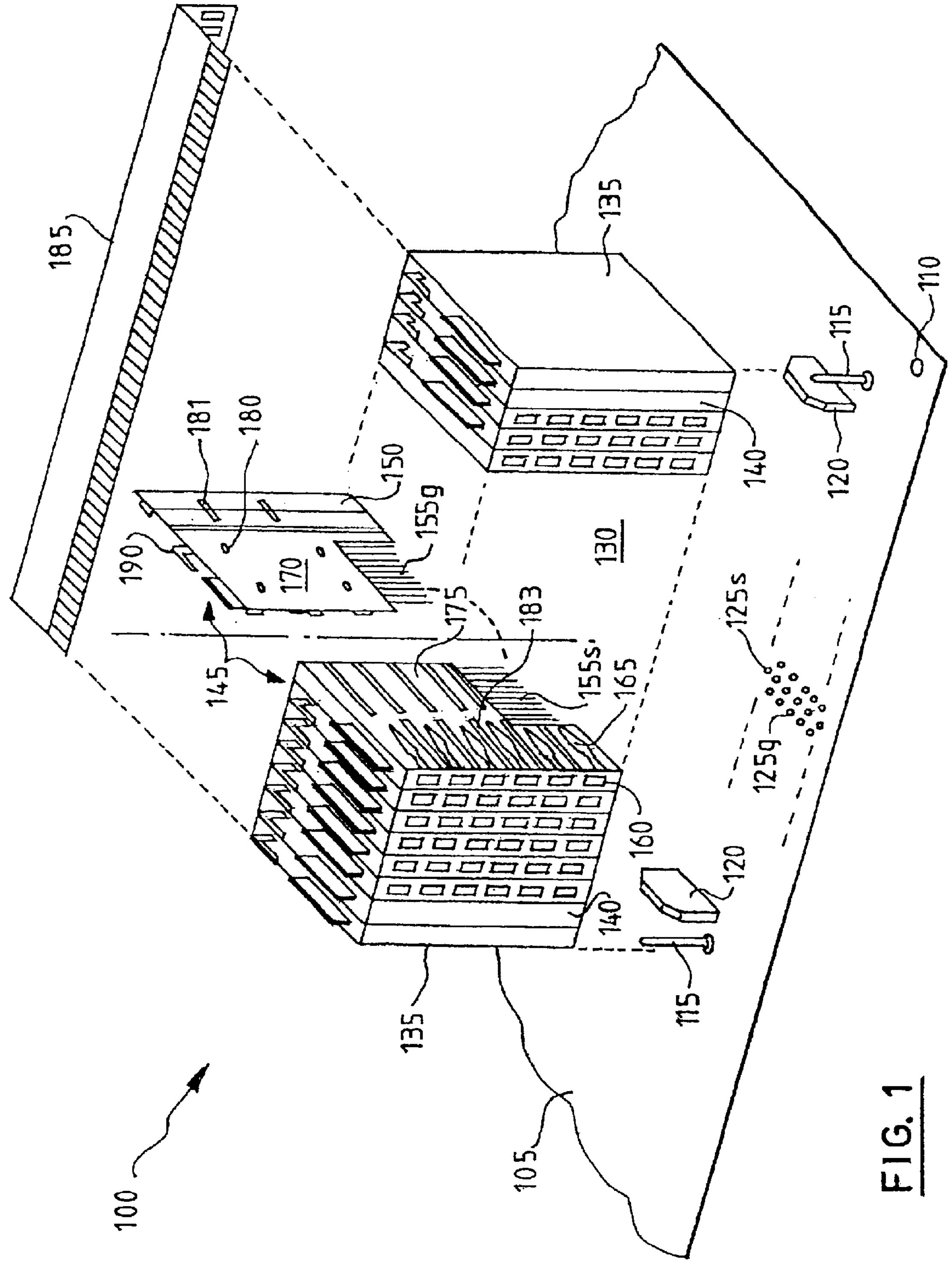
FIG. 1 is an exploded view of an electronic assembly, including a connector, on which the tool of the invention can be used.

With reference in particular to FIG. 1, there is shown an electronic assembly 100. The assembly 100 is formed by a printed circuit board 105 (including an insulating substrate with one or more conductive layers), on which several electronic devices (not shown in FIG. 1) are mounted. Board 105 has two insertion holes 110 (only one shown in FIG. 1), which are arranged at opposed corners thereof.

An upper surface of board 105 is provided with guide pins 115 and power sockets 120. A matrix of plated through-holes is also formed in board 105. The matrix is comprised of columns with six holes 125*s* (for transmitting electrical signals) and columns with five holes 125*g* (connected to a reference terminal, or ground). The columns of ground holes 125*g* are arranged in a staggered manner between each column of signal holes 125*s*. Guide pins 115, power sockets 120 and matrix of holes 125*s* and 125*g* are aligned along a front edge of board 105.

A female press-fit connector 130 is attached to board 105. Connector 130 comprises a stack of modules which are arranged side by side; particularly, connector 130 includes one or more guidance modules 135, one or more power modules 140 and several wafer modules 145 (typically in multiples of 10 or 25).

Each wafer module 145 comprises an insulating body 150 made of plastic material. The insulating body 150 holds a column with six signal pins 155*s* and a parallel column with five ground pins 155*g*, for insertion into a corresponding column of signal holes 125*s* and a corresponding column of ground holes 125*g*, respectively. The ground pins 155*g* are staggered with respect to the signal pins 155*s*. Each of the pins 155*s* and 155*g* extend downward from the insulating body 150 and comprises a metal blade with a compliant structure (defined by a respective central hole).

Six receptacles 160 for insertion of mating pins of a male connector (not shown in the FIG. 1) are arranged on a front edge of the insulating body 150. Each receptacle 160 houses a conductive fork 165 (provided on a front side of the module 145), which is connected to a respective signal pin 155*s*. Forks 165 and signal pins 155*s* extend at right angles relative to one another. Each fork 165 is formed by a pair of opposed cantilever beams, which act as a spring exerting an anti-stubbing pressure on the inserted pin of the male connector. A ground plane 170 is provided on a rear side of the module 145, this ground plane 170 being connected to all the ground pins 155*g*. In this way, each row of signal pins 155*s* is sandwiched between two adjacent ground planes 170, which define a stripline shielding for reducing undesirable interactions between adjacent columns of signal pins 155*s*.

The front side of module 145 features several horizontal channels 175 formed by corresponding ribs provided on insulating body 150. The insulating body 150 further includes four alignment pins 180 and two wings 181 extending backwards (through respective openings in ground plane 170 as far as the alignment pins 180 are concerned). Wings 181 are used to increase the electrical contact between ground plane 170 and a corresponding ground plane of the male connector. Alignment pins 180 engage corresponding channels 175 of an adjacent module, whereas wings 181 engage corresponding seats 183 formed in the front surface of the adjacent module between adjacent conductive forks 165. A stiffener 185 is stamped from a strip of metal, which is then bent at a right angle, as shown. Stiffener 185 includes holes for mating with corresponding locking tabs 190 provided at the top of each module 135, 140 and 150.

Connector 130 is assembled by stacking modules 135, 140 and 150 in a side-by-side orientation. Alignment pins 180 and wings 181 engage respective channels 175 and seats 183, thereby positioning the modules of connector 130. The interference between these elements prevents each module from slipping off the stack along a direction perpendicular to a longitudinal axis thereof. Stiffener 185 is fitted onto modules 135, 140 and 145 and holds together the modules for increased strength and rigidity of connector 130.

Connector 130 is press-fitted on the front edge of board 105. Each guidance module 135 is provided with a hole, which is coupled to the corresponding guide pin 115, to thereby align connector 130 during positioning on the board. Power modules 140 are joined to the corresponding power sockets 120 while at the same time, the signal pins 155*s* and the ground pins 155*g* of each module 145 are inserted into the corresponding signal holes 125*s* and ground holes 125*g*, respectively, and are held therein by friction.

Connector 130 is used as an edge mounted connector. For example, board 105 may be a daughterboard such that the connector is used to mate board 105 to a backplane assembly (wherein a corresponding male connector is provided). Alternatively, board 105 may be an extender card and the connector then is used to mate the board 105 to another board. Additional possibilities are well within the abilities of one skilled in the art.

Figure 2A:
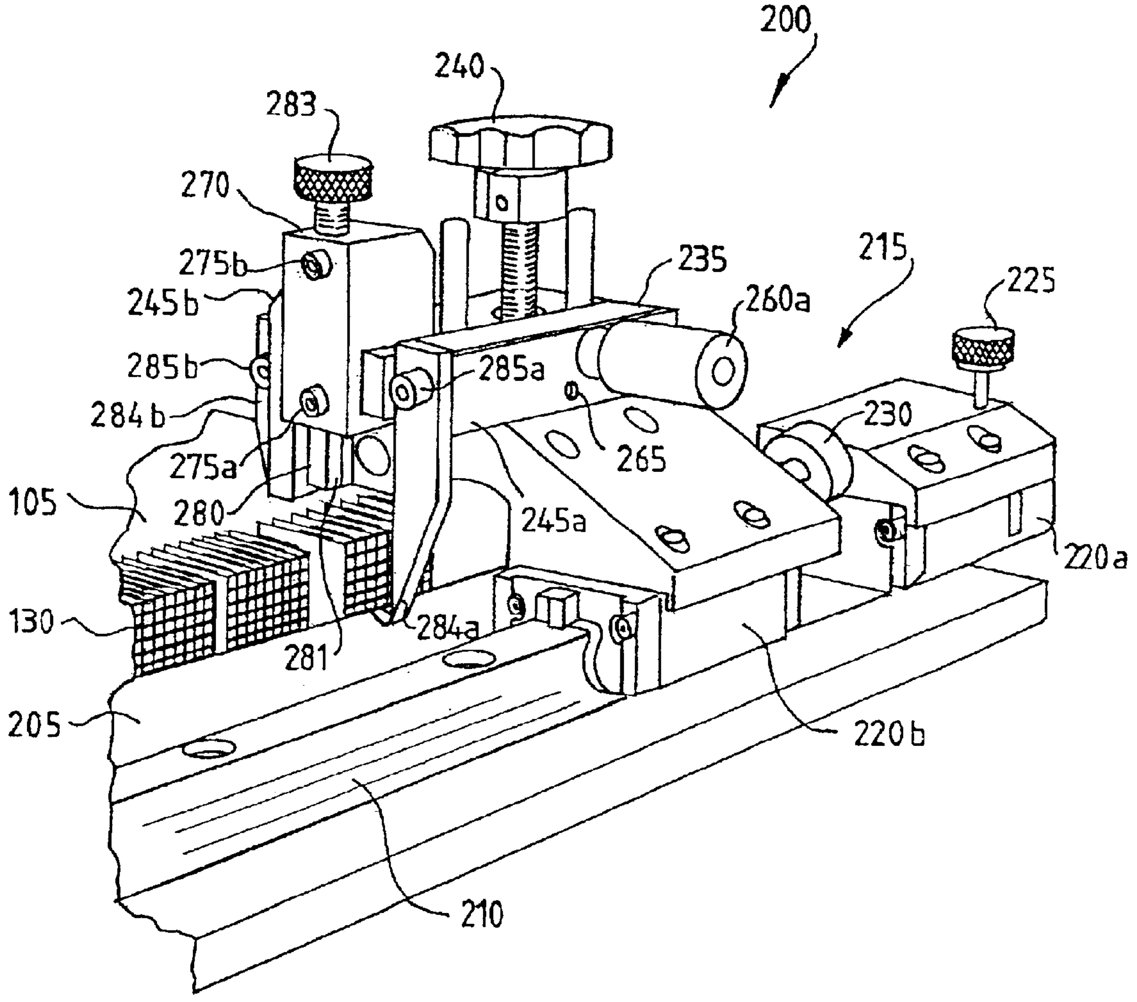
FIG. 2*a* is an enlarged, partial view of the tool according to one aspect of the invention.
Figure 2B:
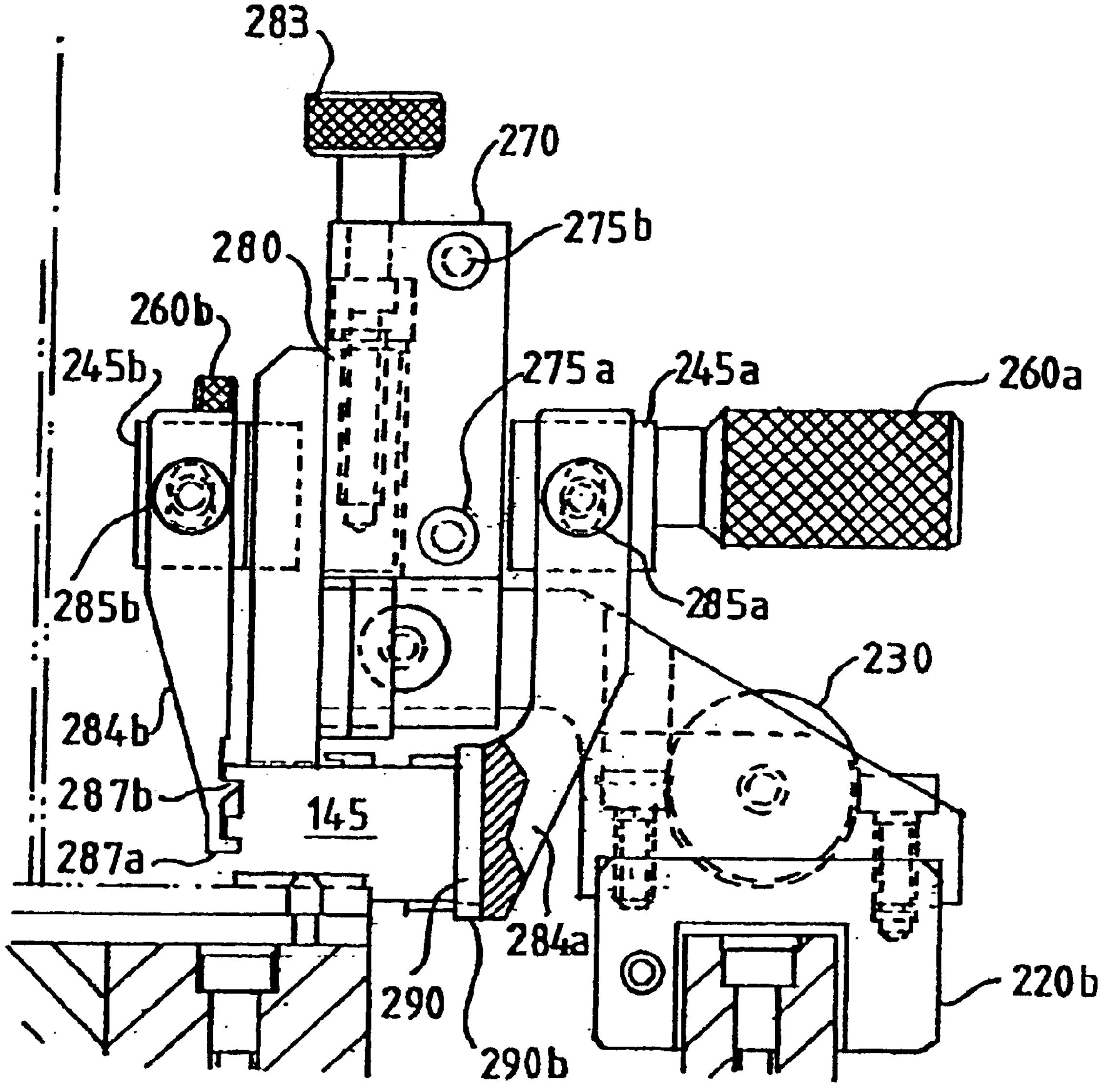
FIG. 2*b* is a front elevational view of the tool of FIG. 2*a;*

With reference now to FIGS. 2*a* and 2*b*, there is shown a tool 200 for reworking connector 130, and in particular for removing a selected module (for example a faulty module) from board 105 on which the connector is positioned. Tool 200 includes a frame 205, which is used to hold board 105 (as described in detail in the following).

A rail 210 for a slide 215 is integral with frame 205. Slide 215 includes two independently movable bases 220*a* and 220*b*. A locking screw 225 (having an upper knob as shown) is inserted into a corresponding vertical threaded through-hole of base 220*a*. Locking screw 225 is used to prevent sliding of base 220*a* along rail 210. Base 220*b* is connected to base 220*a* by means of a right-and-left regulating screw 230 (provided with a central knurling disc), which is inserted into facing horizontal threaded holes of both bases 220*a* and 220*b*.

Base 220*b* features a cantilever portion bridging the edge of board 105 on which connector 130 is mounted. A head 235 has two vertical through-holes, which are adapted for having respective guide pins projecting upward from the cantilever portion of the base 220*b* positioned therein. Head 235 is moved up and down by means of pulling screw 240 (ending with an upper knob, as shown), which is inserted into a corresponding vertical threaded through-hole of head 235.

Head 235 carries two opposed arms 245*a* and 245*b*. Particularly, a central threaded pin and two lateral guide pins extend horizontally from the right side of head 235 (in FIG. 2*a*). Arm 245*a* has three horizontal through-holes for the corresponding pins of head 235. A spring associated with the central pin of these (not shown in FIGS. 2*a*, 2*b*) biases arm 245*a* away from the right side of head 235. A knurled handle 260*a* is screwed onto the central pin and used to move arm 245*a* to the right and left (FIG. 2*b*). In a similar manner, arm 245*b* is moved to the right and to the left by means of a knurled disc 260*b* (FIG. 2*b*). A set screw 265 is inserted into a respective horizontal threaded through-hole of arm 245*a* and used to regulate a stop position of the arm 245*a*. A similar structure (not shown in the figure) is used to regulate the stop position of arm 245*b* as well as head 235.

Head 235 includes a vertical guide 270 arranged between arms 245*a* and 245*b*. Guide 270 includes an elongated element having a U-shaped cross-section (closed at the top) and a front plate fixed to the elongated element by means of two screws 275*a* and 275*b*. A pressing element 280 slides inside guide 270. Pressing element 280 has a vertical slit 281 for accommodating the faulty module removed from the board 105. As shown in FIG. 2*b*, pressing element 280 is moved up and down by means of a positioning screw 283 (ending with an upper knurled knob). Positioning screw 283 passes through a top side of vertical guide 270, where it is held by two collars. A lower end of positioning screw 283 is inserted into a vertical threaded hole of pressing element 280.

Figure 2C:
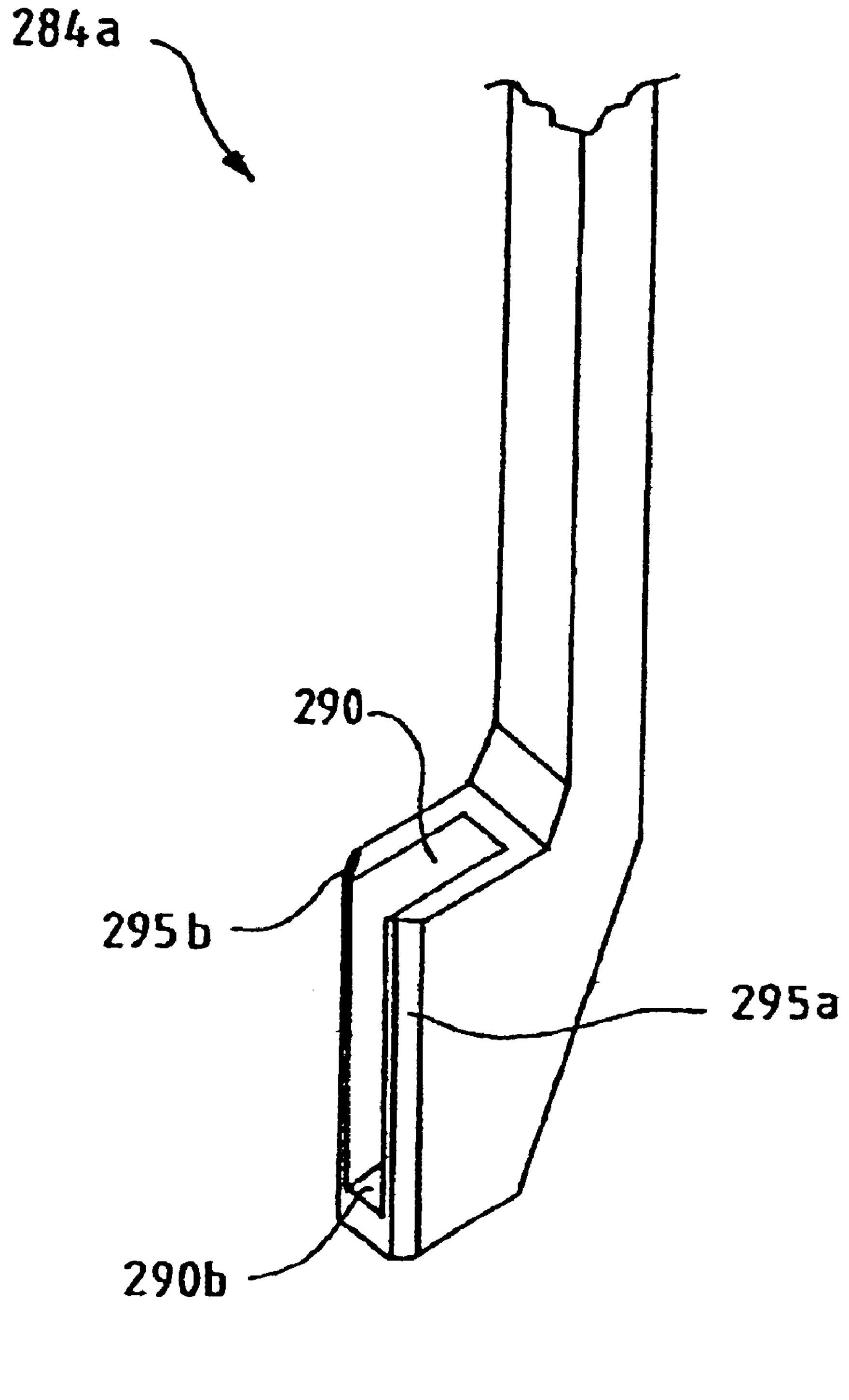
FIG. 2*c* depicts an enlarged perspective view of a jaw of the tool.

A jaw 284*a* is fixed on a front side of arm 245*a* by means of a screw 285*a*. In a similar manner, a jaw 284*b* is fixed on a front side of the arm 245*b* by means of a screw 285*b*. Jaw 284*b* ends with two hooks 287*a* and 287*b* for engaging corresponding lateral projections of a faulty module 145. Jaw 284*a* has a vertical slit 290 for receiving an external lateral edge of the faulty module 145. Slit 290 is closed by bottom surface 290*b*, in order to define a hook for engaging the faulty module designated for removal. As shown in FIG. 2*c*, jaw 284*a* is wedge-shaped. Particularly, slit 290 is arranged between two inclined surfaces 295*a* and 295*b* (with respect to the faulty module). Inclined surfaces 295*a* and 295*b* define an angle preferably in the range between 25°–40°.

Figure 3:
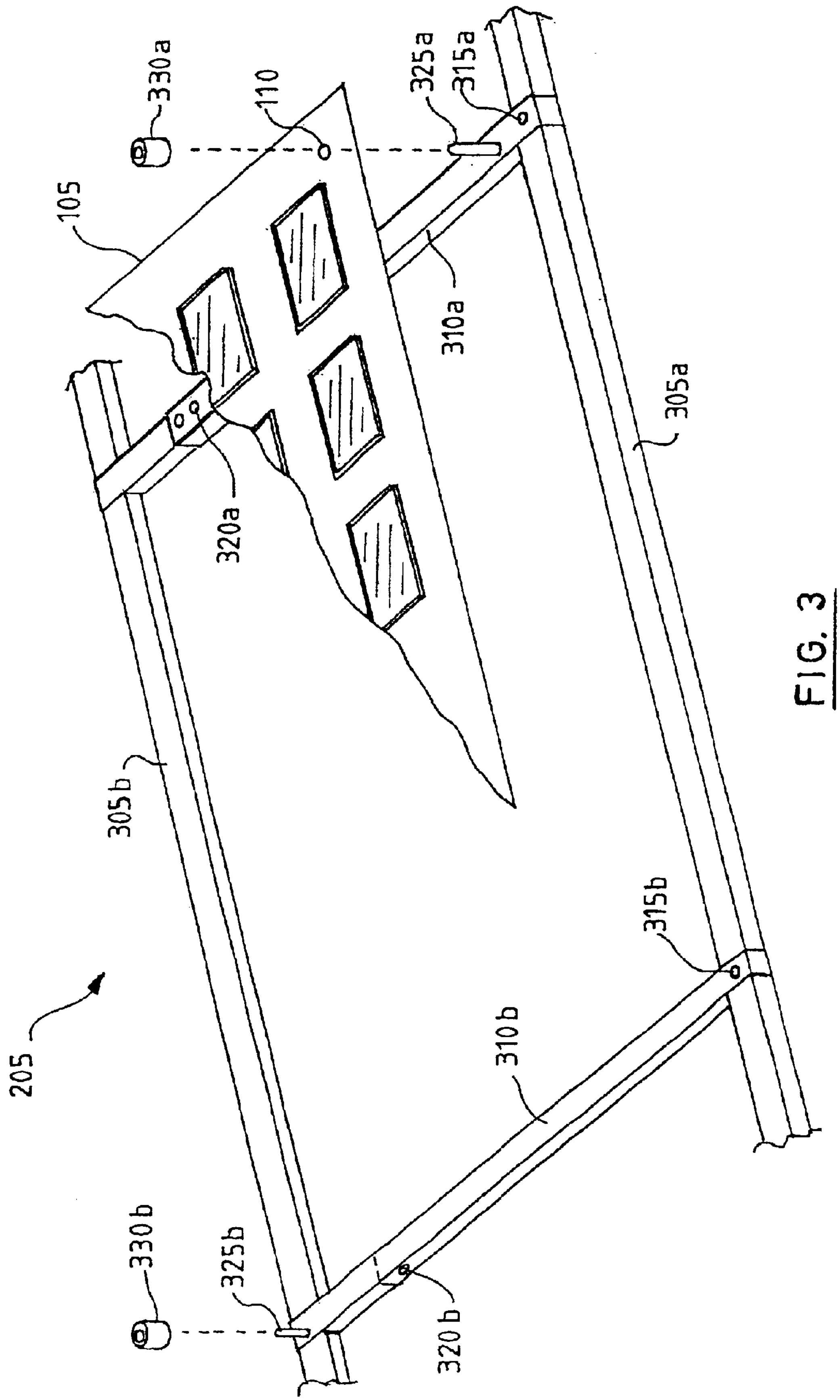
FIG. 3 illustrates a frame of the tool.

With reference now to FIG. 3, frame 205 comprises a side-member 305*a* (fastened to rail 210) and a parallel side-member 305*b*, while two cross-pieces 310*a* and 310*b* extend perpendicularly between the side-members 305*a* and 305*b*. Each cross-piece 310*a* and 310*b* includes a channeled end for sliding along the respective side-members 305*a* and 305*b*. Locking screws 315*a* and 315*b* are used to keep cross-pieces 310*a* and 310*b*, respectively, in a selected position. The cross-pieces 310*a* and 310*b* have a telescopic structure, with the length of each cross-piece 310*a* and 310*b* being regulated by screws 320*a* and 320*b*, respectively.

Two reference threaded pins 325*a* and 325*b* (for insertion holes 110 of board 105 as seen in FIG. 1) extend upward near a front end of a respective cross-piece 310*a* and a rear end of cross-piece 310*b*, respectively. Nut 330*a* (for reference pin 325*a*) and nut 330*b* (for reference pin 325*b*) are used to hold board 105 in place.

Each time a connector must be reworked, frame 205 is regulated according to the dimension of board 105. Particularly, locking screws 315*a* and 315*b* are loosened, and cross-pieces 310*a* and 310*b* are moved to the right or to the left until their distance fits the length of board 105. Locking screws 315*a* and 315*b* are then tightened. Similarly, regulating screws 320*a* and 320*b* are loosened, and cross-pieces 310*a* and 310*b* are extended or shortened until their length fits the width of board 105. Regulating screws 320*a* and 320*b* are then tightened. Board 105 is placed onto frame 205, and reference pins 325*a* and 325*b* are fitted into insertion holes 110. Board 105 is then secured by screwing nuts 330*a* and 330*b* onto reference pins 325*a* and 325*b*.

To remove stiffener 185 from connector 130, slide 215 (FIG. 2*a*) is moved horizontally (with head 235 in a raised position and jaws 284*a* and 284*b* in an open position) until jaws 284*a* and 284*b* are roughly positioned over the faulty module to be removed. Base 220*a* is locked by tightening locking screw 225 and base 220*b* is then finely positioned by tightening regulating screw 230.

Pressing element 280 is lowered by loosening positioning screw 283, until it abuts against connector 130. In a similar manner, head 235 is lowered by loosening screw 240, until jaws 284*a* and 284*b* face the corresponding lateral edges of the designated faulty module. The stop position of the head 235 (defined by abutment of the corresponding set screw against a top surface of the cantilever portion of base 220*b*) prevents jaw 284*a* from touching board 105.

Jaws 284*a* and 284*b* are then closed on the faulty module individually. In particular, arm 245*a* carrying jaw 284*a* is moved to the left (by tightening knurled handle 260*a*), and arm 245*b* carrying jaw 284*b* is moved to the right (by tightening knurled disc 260*b*), until jaws 284*a* and 284*b* abut against the corresponding lateral edges of the faulty module. The pre-defined stop positions of arms 245*a* and 245*b* (defined by abutment of the respective set screws against the corresponding lateral surfaces of bead 235) prevent jaws 284*a* and 284*b* from damaging connector 130.

Figure 4:
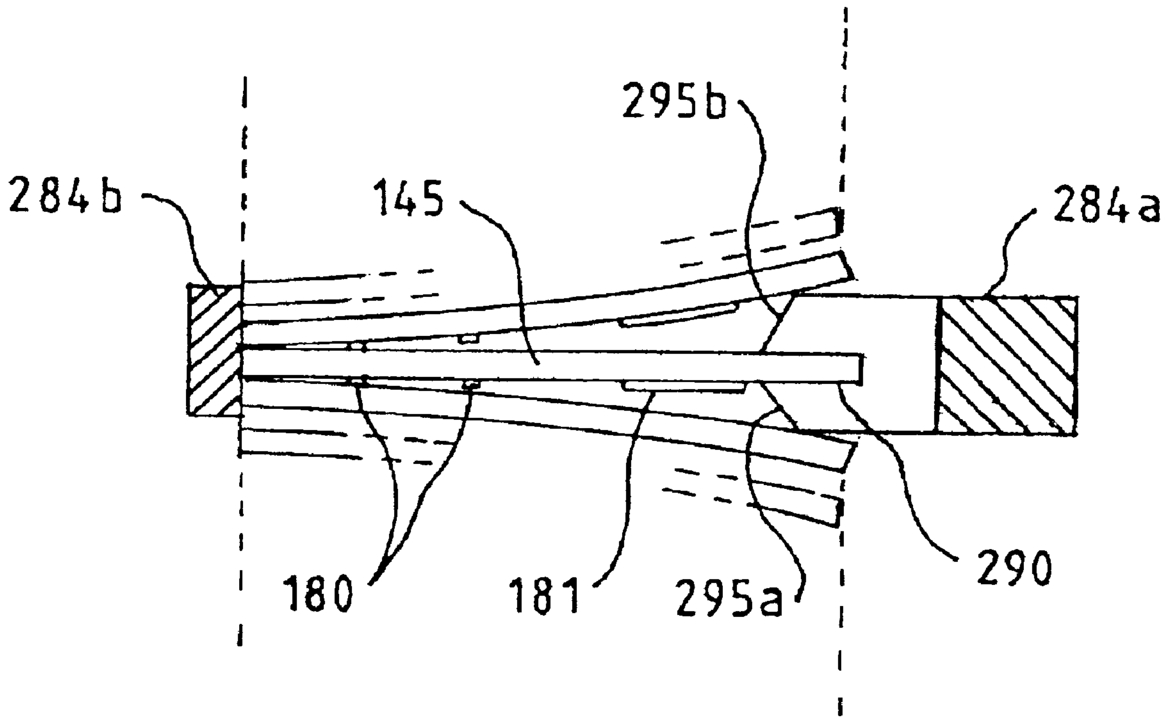
FIG. 4 shows the action of the jaw of FIG. 2*c* on the connector.

As shown in FIG. 4, faulty module 145 is inserted into slit 290 of jaw 284*a*. At the same time, the inclined surfaces 295*a* and 295*b* exert a pressure on the corresponding lateral edge of the adjacent modules (two shown, one on each side of the interim faulty module). In this way, the adjacent modules are separated from the faulty module; particularly, alignment pins 180 and wings 181 are disengaged from the respective channels and seats.

Head 235 (FIGS. 2*a* and 2*b*) is raised by tightening screw 240. In this way, faulty module 145 is pulled from board 105 by sliding along slit 281, while the adjacent modules are kept in position by pressing element 280. Jaws 284*a* and 284*b* are opened by loosening knurled discs 260*a* and 260*b*, respectively. The removed faulty module is then slipped off slit 281 and scrapped. The pins of a new module are seated into the corresponding holes of board 105, and the new module is pressed by means of a plastic hammer until all modules of the connector are flush. The stiffener is reinstalled and board 105 is removed from the tool.

Similar considerations apply if the jaws are moved in a different manner, if the jaws have a different structure (for example, if both of them are wedge-shaped), if the tool includes other elements (for example, a stop arranged between the jaws for regulating their distance in the close position), and the like.

More generally, the present invention provides a tool used for reworking a press-fit connector attached to an electronic board and having a plurality of stacked wafer modules. The tool includes a first and a second jaw for grasping and removing a selected one of the modules from the board, holding means for holding the board and means for moving the jaws relative to the holding means. At least one of the jaws has means for separating each module adjacent the selected module from the selected module.

The solution of the invention provides a controlled movement of the jaws. As a consequence, the faulty module can be extracted without any damage to the adjacent modules and to the board.

The double effect of the jaw, which grasps the faulty module and separates the adjacent modules at the same time, unlocks the faulty module from the adjacent modules. This result is obtained in a very efficient manner, without requiring any shims or the like. The solution according to the present invention is particularly advantageous when some means of engagement between adjacent modules are provided (even if the use of the tool for a different connector is not excluded).

The preferred embodiment of the present invention described above offers further advantages. Particularly, the wedge-shaped jaw (with the inclined surfaces) and the means used to move the jaws between the open and the close position along a direction parallel to the faulty module provide a very efficient structure. This result is obtained in a simple and cost effective manner.

The elements used for moving the jaws (such as the slide and the rail) make the tool very easy to use. In addition, the provision of two bases for the slide allows the position of the jaws to be regulated in a very accurate manner.

Moreover, the pressing element guarantees that the removal of the faulty module does not affect the adjacent modules of the connector, which further increases the reliability of the tool.

The jaws are individually removable from the tool (by acting on the respective screws). Similarly, the pressing element can be removed by unscrewing the front plate of the corresponding guide. In this way, the tool may be used on different types of connectors simply by replacing the jaws and the pressing element. Moreover, the frame can be adjusted according to the dimension of the board, so that the tool can be used to rework connectors included in any type of electronic assembly.

Likewise considerations apply if the jaws have a different structure (for example with separating blades, or other equivalent means), if the jaws are moved relative to the frame in a different manner (for example by means of a cogwheel, or other drive structure), if the pressing element includes two distinct blocks (or other equivalent means), or if the jaws and the pressing element are snap-fitted onto the slide. Alternatively, the frame may only be regulated in a few pre-set positions, the board is clamped onto the frame, or different means for holding the board are provided.

However, the solution of the present invention leads itself to be carried out even with a slide comprised of a single element, without any pressing element, with the jaws and the pressing element not removable from the slide, or with a frame of fixed dimensions.

Naturally, in order to satisfy local and specific requirements, a person skilled in the art may apply to the solution described above many modifications and alterations all of which, however, are included within the scope of protection of the invention as defined by the following claims.

What is claimed is:

1. A tool for reworking a connector attached to an electronic board and having a plurality of stacked modules, said tool including first and second jaws for grasping and removing a selected one of said modules from said board, a holding structure for holding said board and movement structure for moving said jaws relative to said holding structure, at least one of said jaws having a wedge shape with first and second inclined surfaces for separating a module adjacent said selected module from said selected module, said at least one of said jaws including a slit between said first and second inclined surfaces for receiving a corresponding lateral edge of said selected module therein, such that said selected module can be removed from said connector without damage to said module adjacent said selected module.

2. The tool according to claim 1, further including a drive structure for moving said first and second jaws between an open position and a closed position along a direction parallel to said selected module for removal.

3. The tool according to claim 2, wherein said connector includes a longitudinal axis perpendicular to each of said stacked modules, said tool further including a second drive structure for moving said first and second jaws along a direction perpendicular to said electronic board and a third drive structure for moving said first and second jaws along a direction parallel to said longitudinal axis of said connector.

4. The tool according to claim 3, wherein said third drive structure includes a slide having said first and second jaws and said first and second drive structures positioned thereon.

5. The tool according to claim 4 further including a locking structure for locking said slide in a selected position.

6. The tool according to claim 1, wherein said at least one jaw of said jaws includes a bottom closed wall at one end of said slit to define a first hook for engaging said selected module to facilitate removal thereof.

7. The tool according to claim 6, wherein the second of said jaws includes a second hook for engaging said selected module to further facilitate removal thereof.

8. The tool according to claim 1, further including a pressing member for preventing removal of said module adjacent said selected module during said removal of said selected module.

9. A tool for reworking a connector attached to an electronic board, said connector having a plurality of stacked modules, said plurality of stacked modules including a selected module to be removed from said electronic board and at least one of a first and a second adjacent modules respectively located on opposite sides of said selected module, said tool comprising:

a holding structure for holding said electronic board;

a jaw for receiving said selected module, said jaw including a wedge and a slit; and a movement structure for moving said jaw relative to said holding structure, wherein said wedge separates said at least one of said first and said second adjacent modules from said selected module, with said selected module received in said slit of said jaw.

* * * * *